(12) United States Patent
Moriceau et al.

(10) Patent No.: US 10,755,967 B2
(45) Date of Patent: Aug. 25, 2020

(54) METHOD FOR TRANSFERRING A USEFUL LAYER

(71) Applicant: Commissariat a l'energie atomique et aux energies alternatives, Paris (FR)

(72) Inventors: Hubert Moriceau, Saint-Egreve (FR); Christophe Morales, Saint Pierre de Mesage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 16/225,530

(22) Filed: Dec. 19, 2018

(65) Prior Publication Data

US 2019/0206721 A1   Jul. 4, 2019

(30) Foreign Application Priority Data

Dec. 22, 2017   (FR) ..................... 17 62969

(51) Int. Cl.
| | | |
|---|---|---|
| *H01L 21/762* | (2006.01) | |
| *H01L 41/312* | (2013.01) | |
| *H01L 29/16* | (2006.01) | |
| *H01L 29/161* | (2006.01) | |
| *H01L 29/20* | (2006.01) | |
| *H01L 41/187* | (2006.01) | |

(52) U.S. Cl.
CPC ...... *H01L 21/76254* (2013.01); *H01L 41/312* (2013.01); *H01L 29/16* (2013.01); *H01L 29/161* (2013.01); *H01L 29/20* (2013.01); *H01L 41/1873* (2013.01); *H01L 41/1876* (2013.01)

(58) Field of Classification Search
CPC .................................. H01L 21/76254
USPC ........................................ 257/458
See application file for complete search history.

(56) References Cited

U.S. PATENT DOCUMENTS

| 6,403,450 | B1 | 6/2002 | Maleville et al. | |
|---|---|---|---|---|
| 2007/0216042 | A1* | 9/2007 | Delprat ............. | H01L 21/02032 438/471 |

(Continued)

OTHER PUBLICATIONS

French Preliminary Search Report dated Aug. 23, 2018 in French Application 17 62969, dated Dec. 22, 2017 (with English Translation of Categories of Cited Documents & Written Opinion).

(Continued)

*Primary Examiner* — Jami Valentine Miller
(74) *Attorney, Agent, or Firm* — Oblon, McClelland, Maier & Neustadt, L.L.P.

(57) ABSTRACT

A method is provided, including successive steps of a) providing a donor substrate covered with a layer of oxide; b) implanting gaseous species in the donor substrate, through the layer to form an embrittlement zone, and at the end of step b), the layer has an absorbance peak with a maximum at a first wavenumber, and with a full width at half maximum; c) applying ultraviolet radiation to the free surface of the layer under an ozone atmosphere and according to a thermal budget for: shifting the maximum by at least 3 $cm^{-1}$ towards increasing wavenumbers, reducing the full width at half maximum by at least 3 $cm^{-1}$, and allowing direct adhesion with the free surface; d) assembling the donor substrate on the supporting substrate by direct adhesion with the free surface; and e) splitting the donor substrate along the embrittlement zone to expose a useful layer.

19 Claims, 2 Drawing Sheets

(56) References Cited

U.S. PATENT DOCUMENTS

| | | | |
|---|---|---|---|
| 2008/0064182 A1* | 3/2008 | Hebras | H01L 21/76254 438/455 |
| 2008/0102601 A1* | 5/2008 | Bourdelle | H01L 21/02667 438/458 |
| 2008/0176380 A1* | 7/2008 | Reynaud | H01L 21/02032 438/458 |
| 2010/0096733 A1* | 4/2010 | Guiot | H01L 21/76254 257/632 |
| 2010/0155803 A1* | 6/2010 | Sandhu | H01L 21/84 257/310 |
| 2013/0302970 A1* | 11/2013 | Daix | H01L 21/76254 438/458 |

OTHER PUBLICATIONS

Lisovskii, I., et al. "Effect of UV annealing of radiation damage in $SiO_2$ films", Applied Surface Science, vol. 86, No. 1-4, 1995, 4 pages.

Debieu, O., et al. "Effect of the Nd content on the structural and photoluminescence properties of silicon-rich silicon dioxide thin films", Nanoscale Research Letters, vol. 6, No. 1, 2011, 8 pages.

\* cited by examiner

METHOD FOR TRANSFERRING A USEFUL LAYER

TECHNICAL FIELD

The invention relates to the technical field of transfer of a useful layer onto a supporting substrate by Smart Cut™ technology.

The invention notably finds application in the fabrication of substrates of the silicon-on-insulator (SOI) type, but also in the transfer of films of III-V materials, or else in the transfer of a layer protecting a conductive oxide (intended to form an electrode).

PRIOR ART

A method of transfer of a useful layer onto a supporting substrate, known from the prior art, comprises the successive steps of:

$a_0$) providing a donor substrate comprising a first surface covered with a layer of oxide, the layer of oxide having a free surface;

$b_0$) implanting gaseous species in the donor substrate, through the layer of oxide, so as to form an embrittlement zone, the gaseous species comprising ionized hydrogen atoms; the useful layer being delimited by the embrittlement zone and by the first surface of the donor substrate;

$c_0$) assembling the donor substrate on the supporting substrate by direct adhesion with the free surface of the layer of oxide;

$d_0$) splitting the donor substrate along the embrittlement zone so as to expose the useful layer, for example by applying a thermal treatment;

$e_0$) applying a thermal treatment to the assembly obtained at the end of step do), at a temperature above 900° C.

Step $b_0$) of implantation is accompanied conventionally by a change in the nature of the layer of oxide, in particular in the vicinity of the free surface (more particularly for some nanometres under the free surface), which is notably reflected in an increase in the rate of attack of the oxide in this zone by a factor greater than 2. A method of this kind from the prior art allows this problem to be corrected, owing to the thermal treatment in step $e_0$).

However, a method of this kind from the prior art is not entirely satisfactory since the thermal treatment in step $e_0$) is carried out at high temperature, with the following drawbacks:
- a potential impact of the differences in coefficients of thermal expansion (CTE) between the materials of the donor substrate, of the layer of oxide, and of the supporting substrate;
- potential degradation of a material of the assembly (for example, certain III-V materials generally have a limit temperature of degradation below 900° C.);
- potential degradation of the supporting substrate when the latter is functionalized with the presence of metallic levels that do not withstand temperatures above 500° C.

DISCLOSURE OF THE INVENTION

The invention aims to remedy the aforementioned drawbacks completely or partly. For this purpose, the invention relates to a method of transfer of a useful layer onto a supporting substrate, comprising the successive steps of.

a) providing a donor substrate comprising a first surface covered with a layer of oxide, the layer of oxide having a free surface;

b) implanting gaseous species in the donor substrate, through the layer of oxide, so as to form an embrittlement zone, the gaseous species comprising ionized hydrogen atoms; the useful layer being delimited by the embrittlement zone and by the first surface of the donor substrate; the layer of oxide has, at the end of step b), an absorbance peak possessing a maximum at a first wavenumber, and possessing a full width at half maximum;

c) applying ultraviolet radiation to the free surface of the layer of oxide, under an ozone atmosphere, and according to a thermal budget suitable for.
  shifting the maximum of the absorbance peak by at least 3 cm$^{-1}$ towards increasing wavenumbers;
  reducing the full width at half maximum by at least 3 cm$^{-1}$;
  allowing direct adhesion with the free surface of the layer of oxide;

d) assembling the donor substrate on the supporting substrate by direct adhesion with the free surface of the layer of oxide;

e) splitting the donor substrate along the embrittlement zone so as to expose the useful layer.

Thus, a method of this kind according to the invention makes it possible to correct the changes induced by implantation step b) owing to the UV-ozone treatment in step c), which is executed before the adhesive bonding step d). Said treatment in step c) makes it possible to remove some of the hydrogen atoms present in the layer of oxide, which makes it possible to reduce the defects that may appear at the bonding interface. The thermal budget applied in step c) makes it possible to: (i) avoid degradation of the materials of the layer of oxide and of the donor substrate; (ii) have a contribution to the thermal budget for splitting that is small enough to avoid excessively weakening the embrittlement zone before the adhesive bonding step d) (e.g. bubbling, exfoliation), and so as not to cause surface distortion making the free surface of the layer of oxide incompatible with subsequent direct adhesion.

Furthermore, the inventors found, by FTIR-ATR (Fourier transform infrared-attenuated total reflectance) spectroscopy, that such modification of the absorbance peak makes it possible to characterize the effectiveness of the treatment in step c) with respect to reduction of the effects of the damage of the layer of oxide connected with the implantation step b). This reduction of the effects of damage is connected in particular with removal of hydrogen atoms present in the layer of oxide.

Definitions

"Useful layer" means a layer, starting from which a device may be formed for any type of applications, notably electronic, mechanical, optical etc.

"Direct adhesion" means spontaneous adhesive bonding resulting from two surfaces being brought into direct contact, i.e. in the absence of an additional element such as a glue, wax or solder. Adhesion mainly arises from the van der Waals forces resulting from the electronic interaction between the atoms or the molecules of two surfaces, hydrogen bonds due to surface preparations or covalent bonds established between the two surfaces. It is also called bonding by molecular adhesion.

"Thermal budget" means the choice of a temperature value and of a value of duration of the thermal treatment.

"Thermal budget for splitting" means the total thermal budget to be applied after step b) to obtain splitting at the end of step e). A percentage of the thermal budget for splitting may be defined. The thermal budget for splitting may be described by a law of the Arrhenius type for relating the time to splitting (designated t) to the temperature of the thermal treatment (designated T, in K):

$$t = A\exp(-E_a/kT)$$

where:
A is a constant,
$E_a$ is a constant corresponding to the activation energy of the mechanism involved in transfer,
k is the Boltzmann constant.

$E_a$ can be determined experimentally from 2 operating points: it is the slope of the straight line log(t) as a function of 1/kT.

As $E_a$ is known, for a given temperature $T_1$ it is easy to determine the time $t_1$ required to obtain splitting. By convention, it is said that the percentage of the thermal budget used corresponds to the percentage of the time $t_1$ elapsed at the temperature $T_1$. Thus, for example, in order to keep below 10% of the thermal budget for splitting, a duration t less than $t_1/10$ will be selected for a thermal treatment at a temperature $T_1$.

The method according to the invention may comprise one or more of the following characteristic features.

According to one characteristic feature of the invention, the thermal budget in step c) is suitable for shifting the maximum of the absorbance peak by at least 5 cm$^{-1}$ towards increasing wavenumbers, preferably by at least 10 cm$^{-1}$ towards increasing wavenumbers.

According to one characteristic feature of the invention, the splitting in step e) requires a total thermal budget; and step c) is executed according to a thermal budget less than or equal to 10% of the total thermal budget.

Thus, one advantage secured is not excessively weakening the embrittlement zone before the adhesive bonding step d) (e.g. bubbling, exfoliation).

According to one characteristic feature of the invention, the useful layer is made of silicon; and step c) is executed for a time selected between 5 minutes and 6 hours, preferably between 5 minutes and 2 hours, more preferably between 5 minutes and 1 hour.

According to one characteristic feature of the invention, the useful layer is made of silicon; and the temperature of the thermal budget in step c) is between 250° C. and 500° C., preferably between 250° C. and 500° C., more preferably between 290° C. and 400° C.

According to one characteristic feature of the invention, the method comprises a step $d_1$) consisting of applying a thermal treatment to the assembly obtained in step d) according to a thermal budget suitable for reinforcing direct adhesion without initiating splitting of the donor substrate along the embrittlement zone; step $d_1$) being executed before step e).

Thus, one advantage secured is reinforcement of direct adhesion in terms of adherence, making it possible to reduce the size of defects that may appear at the bonding interface.

According to one characteristic feature of the invention, the layer of oxide has a thickness between 0.2 nm and 50 nm, preferably between 1 nm and 15 nm, more preferably between 2 nm and 10 nm.

Thus, one advantage secured is obtaining a very thin buried oxide (BOX) in the case of fabrication of a substrate of the SOI type.

According to one characteristic feature of the invention, the layer of oxide comprises at least one material selected from the following groups:

a dielectric oxide, preferably $SiO_3$, $SrTiO_3$, $Al_2O_x$, $Y_2O_3$, $LaAlO_3$, $LiNbO_3$, $LiTaO_3$;
a conductive oxide, preferably $La_{0.5}Sr_{0.5}CoO_3$, $YBa_2Cu_3O_{7-x}$, $SrRuO_3$, $LaNiO_3$;
a transparent conductive oxide, preferably ZnO, ZnO:In, ZnO:Al, ZnO:F, ZnO:B, ZnO:Ga, $Zn_2SnO_4$, $GaInO_3$:Ge, $GaInO_3$:Sn, $MgIn_2O_4$, $ZnGa_2O_4$, $CuGaO_2$:Fe.

Thus, one advantage secured is potentially obtaining:
a BOX when the material of the layer of oxide is a dielectric oxide;
an electrode when the material of the layer of oxide is electrically conducting (optionally transparent).

According to one characteristic feature of the invention, the donor substrate is made of a material selected from the following groups:
a semiconductor material, preferably Si, Ge, Si—Ge, a III-V material, $Si_{1-x-y}Ge_xSn_y$;
a piezoelectric material, preferably $LiNbO_3$, $LiTaO_3$, $Pb(Zr_x,Ti_{1-x})O_3$.

"III-V material" means a binary alloy between elements located in column III and in column V of the periodic table, respectively.

According to one characteristic feature of the invention, the method comprises a step consisting of forming an additional layer of oxide on the supporting substrate, step d) being executed in such a way that direct adhesion takes place with the additional layer of oxide.

BRIEF DESCRIPTION OF THE DRAWINGS

Other features and advantages will become clear from the detailed account of various embodiments of the invention, the account being provided with examples and references to the accompanying drawings.

FIGS. 1a to 1g are not shown to scale, so as to make them easier to understand.

DETAILED DESCRIPTION OF THE EMBODIMENTS

Figure 1:
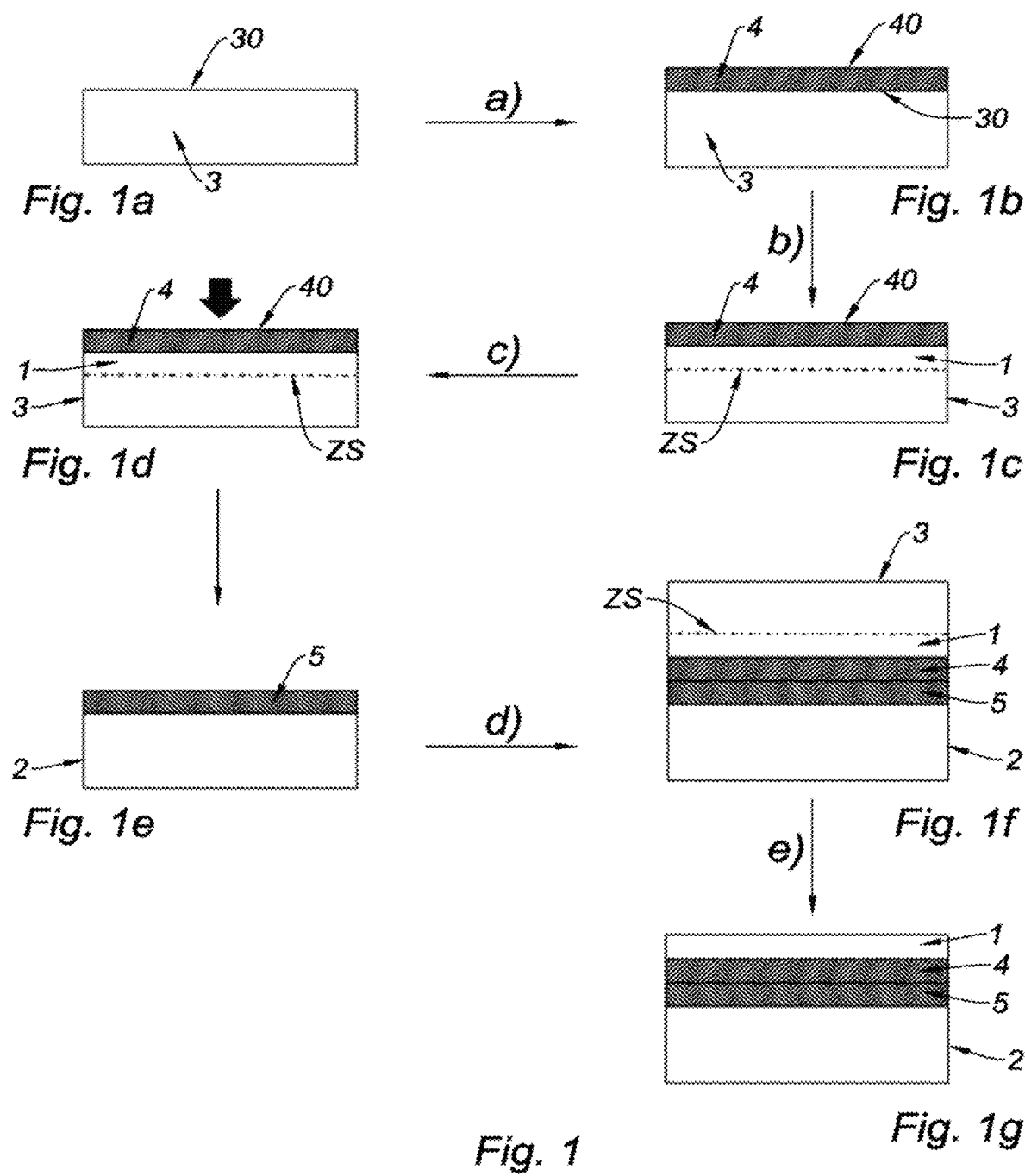
FIGS. 1a to 1g are schematic sectional views illustrating an embodiment of a method according to the invention.

For simplicity, elements that are identical or that provide the same function are given the same references for the various embodiments.

In one of its aspects, the invention relates to a method of transfer of a useful layer 1 onto a supporting substrate 2, comprising the successive steps of:

a) providing a donor substrate 3 comprising a first surface 30 covered with a layer of oxide 4, the layer of oxide 4 having a free surface 40;
b) implanting gaseous species in the donor substrate 3, through the layer of oxide 4, so as to form an embrittlement zone ZS, the gaseous species comprising ionized hydrogen atoms; the useful layer 1 being delimited by the embrittlement zone ZS and by the first surface 30 of the donor substrate 3; at the end of step b), the layer of oxide 4 has an absorbance peak possessing a maximum at a first wavenumber, and possessing a full width at half maximum;
c) applying ultraviolet radiation to the free surface 40 of the layer of oxide 4, under an ozone atmosphere, and according to a thermal budget suitable for:
shifting the maximum of the absorbance peak by at least 3 $cm^{-1}$ towards increasing wavenumbers;
reducing the full width at half maximum by at least 3 $cm^{-1}$;
allowing direct adhesion with the free surface 40 of the layer of oxide 4;
d) assembling the donor substrate 3 on the supporting substrate 2 by direct adhesion with the free surface 40 of the layer of oxide 4;
e) splitting the donor substrate 2 along the embrittlement zone ZS so as to expose the useful layer 1.

Step a) is illustrated in FIGS. 1a and 1b. Step b) is illustrated in FIG. 1c. Step c) is illustrated in FIG. 1d. Step d) is illustrated in FIG. 1f. Finally, step e) is illustrated in FIG. 1g.

Donor Substrate

The donor substrate 3 is made of a material advantageously selected from the following groups:
a semiconductor material, preferably Si, Ge, Si—Ge, a III-V material, $Si_{1-x-y}Ge_xSn_y$;
a piezoelectric material, preferably $LiNbO_3$, $LiTaO_3$, $Pb(Zr_x,Ti_{1-x})O_3$.

It should be noted that other materials are conceivable for the donor substrate 3, such as SiC, quartz, sapphire ($Al_2O_3$).

Layer of Oxide

As an example, the layer of oxide 4 may be formed on the first surface 30 of the donor substrate 3 by thermal oxidation, at 950° C., when the donor substrate 3 is of silicon, and when the layer of oxide 4 is a silicon oxide $SiO_x$.

The layer of oxide 4 advantageously has a thickness between 0.2 nm and 50 nm, preferably between 1 nm and 15 nm, more preferably between 2 nm and 10 nm. However, the layer of oxide 4 may have a thickness greater than 50 nm, for example up to one micron. In this case, only the surface portion of the layer of oxide 4 (typically 10 nm, 20 nm or even 50 nm under the free surface 40) will be altered by the implantation in step b) and modified by the UV-ozone treatment in step c).

The layer of oxide 4 advantageously comprises at least one material selected from the following groups:
a dielectric oxide, preferably $SiO_x$, $SrTiO_3$, $Al_2O_x$, $Y_2O_3$, $LaAlO_3$, $LiNbO_3$, $LiTaO_3$;
a conductive oxide, preferably $La_{0.5}Sr_{0.5}CoO_3$, $YBa_2Cu_3O_{7-x}$, $SrRuO_3$, $LaNiO_3$;
a transparent conductive oxide, preferably ZnO, ZnO:In, ZnO:Al, ZnO:F, ZnO:B, ZnO:Ga, $Zn_2SnO_4$, $GaInO_3$: Ge, $GaInO_3$:Sn, $MgIn_2O_4$, $ZnGa_2O_4$, $CuGaO_2$:Fe.

The layer of oxide 4 may be a layer made of a material selected from the aforementioned materials. The layer of oxide 4 may be a stack of sublayers made of different materials selected from the aforementioned materials. The layer of oxide 4 may comprise a surface portion (in the vicinity of the free surface 40) made of a material selected from the aforementioned materials.

Supporting Substrate

As illustrated in FIG. 1e, the method may comprise a step consisting of forming an additional layer of oxide 5 on the supporting substrate 2, step d) then being executed in such a way that direct adhesion takes place with the additional layer of oxide 5.

The additional layer of oxide 5 is preferably made of the same material as that of the layer of oxide 4, or of the same material as that at the surface of the layer of oxide 4.

Implantation Step b)

In step b), it is possible to carry out co-implantation with other gaseous species (e.g. helium), or else carry out multiple implantations of the same gaseous species.

As a non-limiting example, when the donor substrate 3 is made of silicon, step b) may be executed with ionized hydrogen atoms according to the following parameters:
energy between 65 keV and 85 keV,
a dose of $5 \times 10^{16}$ at·$cm^{-2}$.

At the end of step b), the layer of oxide 4 has an absorbance peak possessing a maximum at a first wavenumber, designated $\sigma_1$, and possessing a full width at half maximum (designated $L_1$).

Step c) of UV-Ozone Treatment

Step c) is executed according to a thermal budget suitable for:
shifting the maximum of the absorbance peak to a second wavenumber, designated $\sigma_2$, giving $\sigma_2 \geq \sigma_1 + 3$ $cm^{-1}$;
reducing the full width at half maximum by at least 3 $cm^{-1}$;
allowing direct adhesion with the free surface 40 of the layer of oxide 4.

In other words, the thermal budget in step c) is greater than a first thermal budget (designated BT1), above which:
the maximum of the absorbance peak is shifted to a second wavenumber, designated $\sigma_2$, giving $\sigma_2 \geq \sigma_1 + 3$ $cm^{-1}$;
the full width at half maximum is reduced by at least 3 $cm^{-1}$ relative to $L_1$.

The thermal budget in step c) is lower than a second thermal budget (designated BT2), above which distortion of the free surface 40 of the layer of oxide 4 makes it incompatible with subsequent direct adhesion.

In other words, the thermal budget applied in step c) is between BT1 and BT2.

The thermal budget in step c) is advantageously suitable for shifting the maximum of the absorbance peak to a second wavenumber giving $\sigma_2 \geq \sigma_1 + 5$ $cm^{-1}$, preferably $\sigma_2 \geq \sigma_1 + 10$ $cm^{-1}$. In other words, the thermal budget in step c) is advantageously suitable for shifting the maximum of the absorbance peak by at least 5 $cm^{-1}$ towards increasing wavenumbers, preferably by at least 10 $cm^{-1}$ towards increasing wavenumbers.

When the donor substrate 3 is of silicon, and when the layer of oxide 4 is a silicon oxide $SiO_x$, the modification of the absorbance peak may be observed by FTIR-ATR over the range [1100-1300] $cm^{-1}$, covering the longitudinal optical modes (LO) and the transverse optical modes (TO) of the vibrations of the Si—O—Si bonds. The infrared spectra obtained by FTIR-ATR are advantageously normalized relative to the maximum value of the reference spectrum, i.e. the spectrum of a reference layer of oxide 4 not submitted to the implantation step b). It is possible to relate the position of the maximum of the absorbance peak to stoichiometry and to the stress of the silicon oxide $SiO_x$, whereas the full width at half maximum of the absorbance peak is connected with structural damage of the silicon oxide $SiO_x$. Thus, the inventors found that the implantation step b) leads to:
- a shift of the maximum of the absorbance peak to decreasing wavenumbers relative to the reference spectrum,
- broadening of the full width at half maximum of the absorbance peak.

Then the inventors found that a UV-ozone treatment executed according to a suitable thermal budget makes it possible to:
- shift the maximum of the absorbance peak towards increasing wavenumbers,
- reduce the full width at half maximum of the absorbance peak;
- which translates into a reduction of the effects of damage of the layer of oxide 4 caused by the implantation step b).

Figure 2:
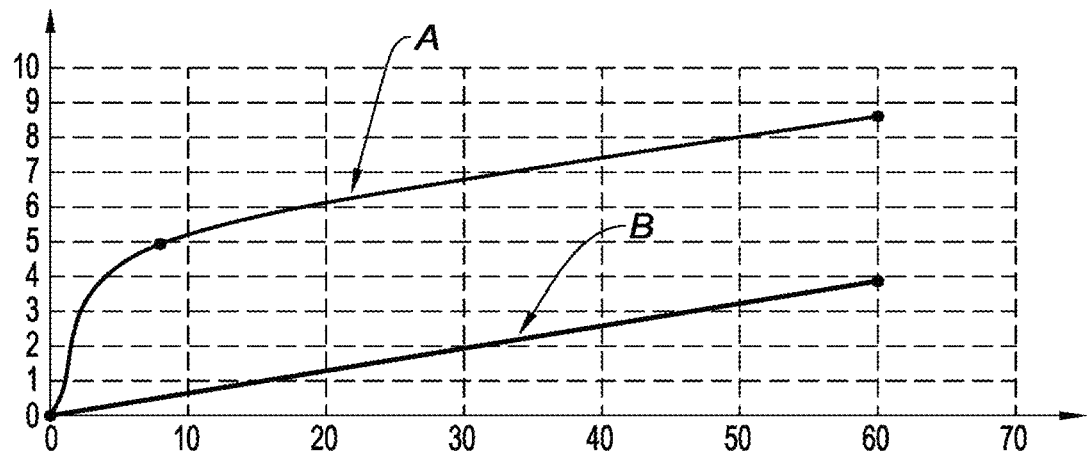
FIG. 2 is a graph showing, on the abscissa, the duration (in minutes) of the UV-ozone treatment executed at 300° C., and on the ordinate, the decrease in the full width at half maximum (in cm$^{-1}$) of the absorbance peak (obtained by FTIR-ATR spectroscopy over the range [1100-1300] cm$^{-1}$) of the layer of oxide treated ($SiO_x$). Curve A corresponds to a thickness of $SiO_x$ of 3 nm with an implantation energy of 65 keV. Curve B corresponds to a thickness of $SiO_x$ of 10 nm with an implantation energy of 76 keV.

In other words, the thermal budget in step c) may be selected according to the desired level of reduction of the effects of damage of the layer of oxide 4. As an example, when the layer of oxide 4 is $SiO_x$, with a thickness of 3 nm, curve A in FIG. 2 shows that a UV-ozone treatment of 60 minutes at 300° C. makes it possible to reduce the full width at half maximum of the absorbance peak by a value of 8.6 $cm^{-1}$, which corresponds to a reduction of about 30% of the effects of the damage of the layer of oxide 4 connected with the implantation step b). For a greater level of reduction, at a constant temperature, it is necessary to carry out a UV-ozone treatment of several hours.

Figure 3:
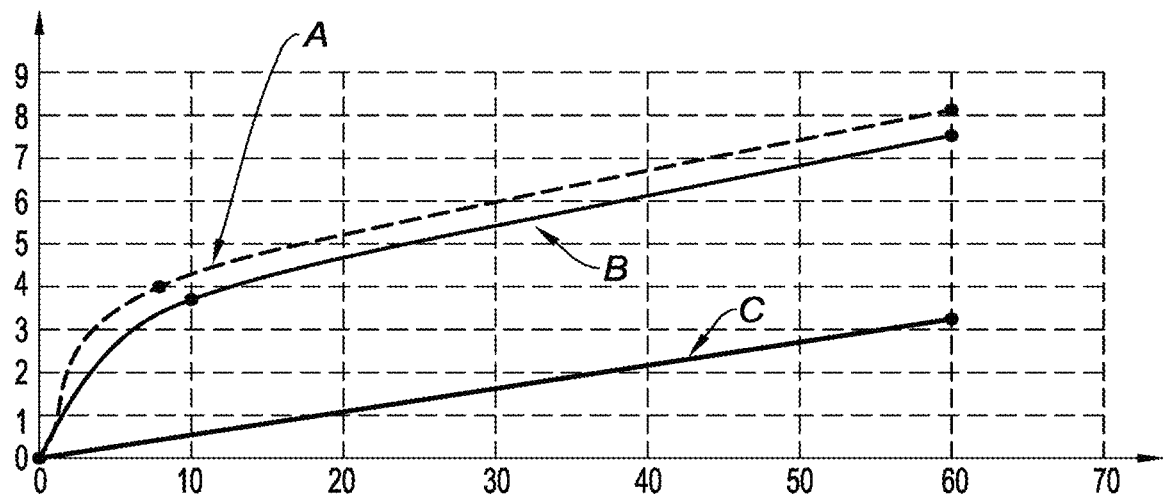
FIG. 3 is a graph showing, on the abscissa, the duration (in minutes) of the UV-ozone treatment executed at 300° C., and on the ordinate, the variation of the wavenumber (in cm$^{-1}$) of the maximum of the absorbance peak (obtained by FTIR-ATR spectroscopy over the range [1100-1300] cm$^{-1}$) of the layer of oxide treated ($SiO_x$). Curve A corresponds to a thickness of $SiO_x$ of 3 nm with an implantation energy of 65 keV. Curve B corresponds to a thickness of $SiO_x$ of 10 nm with an implantation energy of 65 keV. Curve C corresponds to a thickness of $SiO_x$ of 10 nm with an implantation energy of 76 keV.

In the same way, as an example, when the layer of oxide 4 is $SiO_x$, with a thickness of 3 nm, curve A in FIG. 3 shows that a UV-ozone treatment of 60 minutes at 300° C. makes it possible to shift the maximum of the absorbance peak towards increasing wavenumbers by a value of 8 $cm^{-1}$, which corresponds to a reduction of about 70% of the effects of the damage of the layer of oxide 4 connected with the implantation step b). For a greater level of reduction, at a constant temperature, it is necessary to carry out a UV-ozone treatment of several hours.

Splitting in step e) requires a total thermal budget. Step c) is advantageously executed according to a thermal budget less than or equal to 10% of the total thermal budget. Beyond a certain thermal budget, defects appear at the surface (e.g. bubbling, blistering) and make step d) of direct adhesive bonding impossible.

When the useful layer 1 is made of silicon, for example when the donor substrate 3 is made of silicon and the layer of oxide 4 is $SiO_x$, step c) is advantageously executed for a time selected between 5 minutes and 6 hours, preferably between 5 minutes and 2 hours, more preferably between 5 minutes and 1 hour.

The temperature of the thermal budget in step c) is preferably strictly above room temperature, more preferably greater than or equal to 50° C., even more preferably greater than or equal to 100° C. When the useful layer 1 is made of silicon, for example when the donor substrate 3 is made of silicon and the layer of oxide 4 is $SiO_x$, the temperature of the thermal budget in step c) is advantageously between 250° C. and 500° C., preferably between 250° C. and 450° C., more preferably between 290° C. and 400° C.

Step c) may be preceded by a step consisting of cleaning the free surface 40 of the layer of oxide 4 in order to improve its hydrophilicity with a view to step d) of adhesive bonding.

Step d) of Adhesive Bonding

As a non-limiting example, step d) may be executed at high vacuum such as an ultrahigh vacuum less than 10-2 mbar, or else in the controlled atmosphere of a clean room.

Step e) of Splitting

Step e) of splitting is advantageously executed by a thermal treatment according to a suitable thermal budget.

Reinforcement of the Bonding Interface

The method advantageously comprises a step $d_1$) consisting of applying a thermal treatment to the assembly obtained in step d) according to a thermal budget suitable for reinforcing direct adhesion without initiating splitting of the donor substrate 3 along the embrittlement zone ZS; step $d_1$) being executed before step e).

The thermal budget of step $d_1$) is advantageously selected so as not to exceed 10% of the thermal budget for splitting. As a non-limiting example, the temperature of the thermal budget of $d_1$) may be of the order of 300° C. for a duration of the order of one hour.

The method advantageously comprises steps prior to step d), consisting of cleaning and preparing the surfaces to be bonded. As non-limiting examples, these steps prior to step d) may be executed by plasma treatment or by ion beam sputtering (IBS). These steps prior to step d) may require the application of a thermal budget that must remain low enough so as not to initiate splitting of the donor substrate 3 along the embrittlement zone ZS, and not to distort the free surface 40 of the layer of oxide 4 (making it incompatible with subsequent direct adhesive bonding). It will be limited to a thermal budget below 10% of the thermal budget for splitting.

The method advantageously comprises a step f) consisting of applying a thermal treatment to the assembly obtained at the end of step e), according to a thermal budget suitable for reinforcing direct adhesion between the useful layer 1 and the supporting substrate 2.

The invention is not limited to the embodiments presented. A person skilled in the art is able to consider their technically operative combinations, and of replacing them with equivalents.

The invention claimed is:

1. A method for transfer of a useful layer onto a supporting substrate, comprising successive steps of:
   a) providing a donor substrate comprising a first surface covered with a layer of oxide, the layer of oxide having a free surface;
   b) implanting gaseous species in the donor substrate, through the layer of oxide, so as to form an embrittlement zone, the gaseous species comprising ionized hydrogen atoms, the useful layer being delimited by the embrittlement zone and by the first surface of the donor substrate, and at the end of step b), the layer of oxide has an absorbance peak possessing a maximum at a first wavenumber, and possessing a full width at half maximum;
   c) applying ultraviolet radiation to the free surface of the layer of oxide, under an ozone atmosphere, and according to a thermal budget that is sufficient to:
      shift the maximum of the absorbance peak by at least 3 $cm^{-1}$ towards increasing wavenumbers,
      reduce the full width at half maximum by at least 3 $cm^{-1}$, and
      permit direct adhesion of the free surface of the layer of oxide with the supporting substrate;
   d) assembling the donor substrate on the supporting substrate by direct adhesion of the free surface of the layer of oxide with the supporting substrate; and e) splitting the donor substrate along the embrittlement zone so as to expose the useful layer.

2. The method according to claim 1, wherein the thermal budget in step c) is sufficient to shift the maximum of the absorbance peak by at least 5 cm$^{-1}$ towards increasing wavenumbers.

3. The method according to claim 1, wherein the thermal budget in step c) is sufficient to shift the maximum of the absorbance peak by at least 10 cm$^{-1}$ towards increasing wavenumbers.

4. The method according to claim 1, wherein the splitting in step e) requires a total thermal budget, and the thermal budget in step c) is less than or equal to 10% of the total thermal budget.

5. The method according to claim 1, wherein the useful layer is made of silicon, and step c) is executed for a time selected between 5 minutes and 6 hours.

6. The method according to claim 1, wherein the useful layer is made of silicon, and step c) is executed for a time selected between 5 minutes and 2 hours.

7. The method according to claim 1, wherein the useful layer is made of silicon, and step c) is executed for a time selected between 5 minutes and 1 hour.

8. The method according to claim 1, wherein the useful layer is made of silicon, and wherein a temperature of the thermal budget in step c) is between 250° C. and 500° C.

9. The method according to claim 1, wherein the useful layer is made of silicon, and wherein a temperature of the thermal budget in step c) is between 250° C. and 450° C.

10. The method according to claim 1, wherein the useful layer is made of silicon, and wherein a temperature of the thermal budget in step c) is between 290° C. and 400° C.

11. The method according to claim 1, further comprising a step $d_1$) consisting of applying a thermal treatment to the assembly obtained in step d) sufficient to reinforce the direct adhesion without initiating splitting of the donor substrate along the embrittlement zone, with step $d_1$) being executed before step e).

12. The method according to claim 1, wherein the layer of oxide has a thickness between 0.2 nm and 50 nm.

13. The method according to claim 1, wherein the layer of oxide has a thickness between 1 nm and 15 nm.

14. The method according to claim 1, wherein the layer of oxide has a thickness between 2 nm and 10 nm.

15. The method according to claim 1, wherein the layer of oxide comprises at least one material selected from the following groups:
a dielectric oxide;
a conductive oxide; and
a transparent conductive oxide.

16. The method according to claim 15,
wherein the dielectric oxide is selected from among $SiO_x$, $SrTiO_3$, $Al_2O_x$, $Y_2O_3$, $LaAlO_3$, $LiNbO_3$, $LiTaO_3$,
wherein the conductive oxide is selected from among $La_{0.5}Sr_{0.5}CoO_3$, $YBa_2Cu_3O_{7-x}$, $SrRuO_3$, $LaNiO_3$, and
wherein the transparent conductive oxide is selected from among ZnO, ZnO:In, ZnO:Al, ZnO:F, ZnO:B, ZnO:Ga, $Zn_2SnO_4$, $GaInO_3$:Ge, $GaInO_3$:Sn, $MgIn_2O_4$, $ZnGa_2O_4$, $CuGaO_2$:Fe.

17. The method according to claim 1, wherein the donor substrate is made of a material selected from the following groups:
a semiconductor material, and
a piezoelectric material.

18. The method according to claim 17,
wherein the semiconductor material is selected from among Si, Ge, Si—Ge, a III-V material, and $Si_{1-x-y}Ge_xSn_y$, and
wherein the piezoelectric material is selected from among $LiNbO_3$, $LiTaO_3$, and $Pb(Zr_x,Ti_{1-x})O_3$.

19. The method according to claim 1, further comprising a step consisting of forming an additional layer of oxide on the supporting substrate, step d) being executed such that direct adhesion occurs between the free surface of the layer of oxide of the donor substrate and the additional layer of oxide of the supporting substrate.

* * * * *